US009921753B2

(12) United States Patent
Samanta et al.

(10) Patent No.: US 9,921,753 B2
(45) Date of Patent: Mar. 20, 2018

(54) DATA REPLICATION ACROSS HOST SYSTEMS VIA STORAGE CONTROLLER

(71) Applicant: Avago Technologies General IP (Singapore) Pte. Ltd, Singapore (SG)

(72) Inventors: Sumanesh Samanta, Bangalore (IN); Luca Bert, Cumming, GA (US); Naveen Krishnamurthy, Bangalore (IN)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 58 days.

(21) Appl. No.: 14/666,156

(22) Filed: Mar. 23, 2015

(65) Prior Publication Data
US 2016/0283134 A1 Sep. 29, 2016

(51) Int. Cl.
| G06F 12/00 | (2006.01) |
|---|---|
| G06F 13/00 | (2006.01) |
| G06F 13/28 | (2006.01) |
| G06F 3/06 | (2006.01) |
| G11C 14/00 | (2006.01) |
| G06F 12/1081 | (2016.01) |
| G06F 15/173 | (2006.01) |

(Continued)

(52) U.S. Cl.
CPC ............ *G06F 3/0611* (2013.01); *G06F 3/065* (2013.01); *G06F 3/0619* (2013.01); *G06F 3/0665* (2013.01); *G06F 3/0689* (2013.01); *G06F 12/1081* (2013.01); *G06F 13/28* (2013.01); *G06F 15/17331* (2013.01); *G11C 14/0018* (2013.01); *G06F 12/0813* (2013.01); *G06F 12/0835* (2013.01); *G06F 2212/656* (2013.01)

(58) Field of Classification Search
CPC . G06F 3/0619; G06F 12/0813; G06F 12/0835
USPC .................................................. 711/114, 147
See application file for complete search history.

(56) References Cited

U.S. PATENT DOCUMENTS

| 8,775,718 B2 | 7/2014 | Kanevsky et al. |
| 2004/0103417 A1* | 5/2004 | Voellm ................ G06F 9/44521 719/331 |

(Continued)

OTHER PUBLICATIONS

Microsoft Computer Dictionary, 2002, Microsoft Press, Fifth Edition.*

(Continued)

*Primary Examiner* — Charles Rones
*Assistant Examiner* — Sidney Li
(74) *Attorney, Agent, or Firm* — Sheridan Ross P.C.

(57) ABSTRACT

Embodiments herein provide for redundant data storage. One storage system includes first and second host systems each comprising a memory and a persistent storage device. The storage system also includes first and second storage controllers each comprising a memory (e.g., DRAM). The memory of the first storage controller is mapped to the memory of the first host system and the memory of the second storage controller is mapped to the memory of the second host system. The first storage controller is operable to DMA data from the persistent storage device of the first host system to the memory of the first storage controller, and to direct the second storage controller to DMA the data to the persistent storage device of the second host system via the memory of the second storage controller.

24 Claims, 5 Drawing Sheets

(51) Int. Cl.
*G06F 12/0831* (2016.01)
*G06F 12/0813* (2016.01)

(56) References Cited

U.S. PATENT DOCUMENTS

| | | | | |
|---|---|---|---|---|
| 2006/0020744 A1* | 1/2006 | Sinclair | ............... | G06F 12/0246 711/103 |
| 2007/0124407 A1* | 5/2007 | Weber | ................... | G06F 3/0607 709/212 |
| 2007/0168567 A1* | 7/2007 | Boyd | ....................... | G06F 9/546 710/5 |
| 2014/0258775 A1 | 9/2014 | Flynn et al. | | |

OTHER PUBLICATIONS

Peter et al., Arrakis: The Operating System is the Control Plane; Oct. 2014.

* cited by examiner

US 9,921,753 B2

DATA REPLICATION ACROSS HOST SYSTEMS VIA STORAGE CONTROLLER

FIELD OF THE INVENTION

The invention generally relates to redundant data storage.

BACKGROUND

Software Defined Storage (SDS) is software assisted data storage that replicates data across servers (a.k.a. "hosts" or "host systems") to guard against data loss resulting from hard disk drive (HDD) failures and/or system failures. A remote server is used for the replicated data. And, the replicated data generally travels through a network and traverses an entire storage stack of the remote server (e.g., file systems and other operating system components), and even the storage stack of the local server, before being stored in the remote server's HDD. In addition to consuming large amounts of processing and memory capabilities of the remote server, this type of data replication creates Input/Output (I/O) latency in the storage system.

SUMMARY

Systems and methods herein provide for redundant storage. In one embodiment, a storage system includes first and second host systems each comprising a memory and a persistent storage device. The storage system also includes first and second storage controllers each comprising a memory. The first storage controller is communicatively coupled to the first host system and to the second storage controller. The second storage controller is communicatively coupled to the second host system. The memory of the first storage controller is mapped to the memory of the first host system and the memory of the second storage controller is mapped to the memory of the second host system. The first storage controller is operable to direct memory access (DMA) data from the persistent storage device of the first host system to the memory of the first storage controller and to direct the second storage controller to DMA the data to the persistent storage device of the second host system via the memory of the second storage controller.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
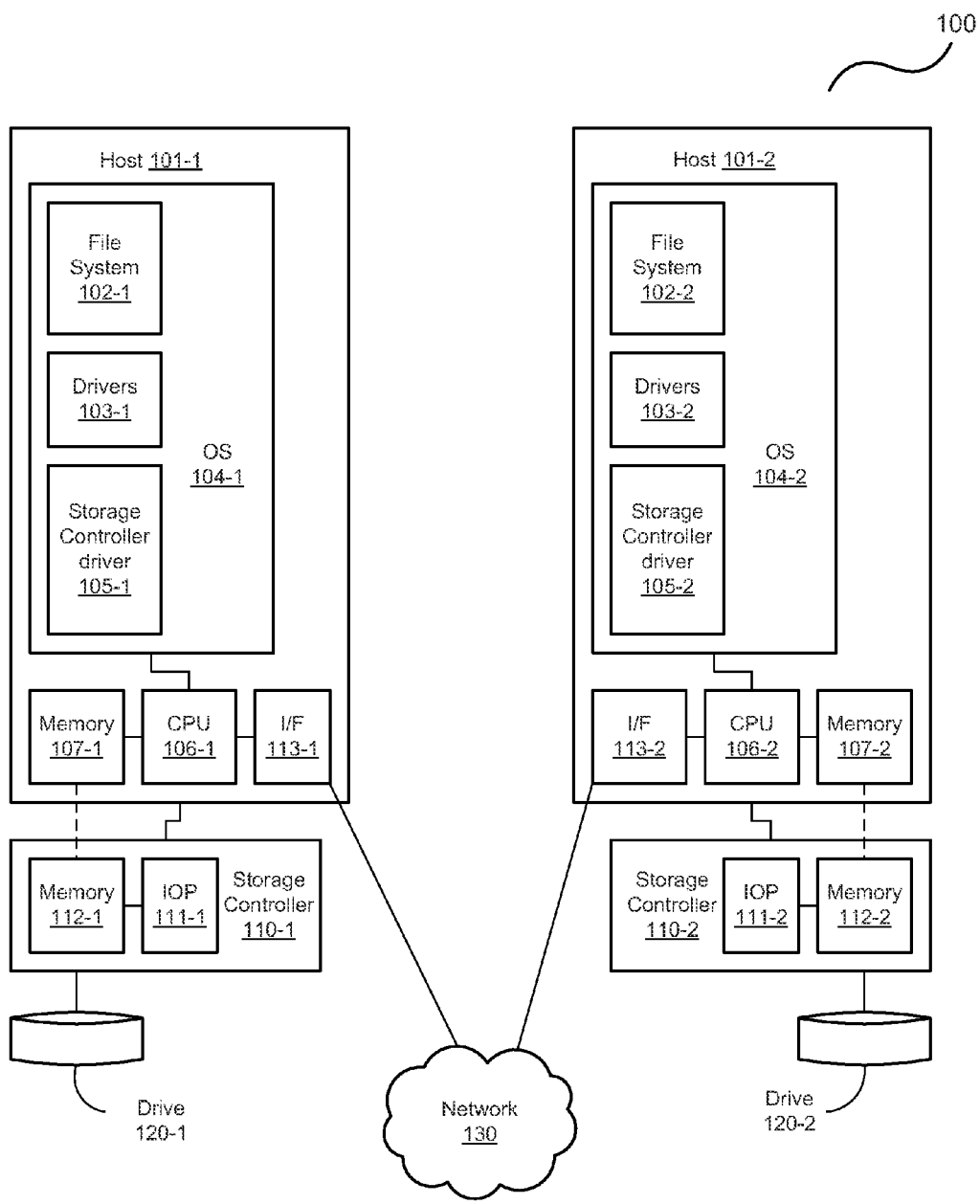
FIG. 1 is a block diagram of a redundant storage system.

FIG. 1 is a block diagram of a redundant storage system 100. The redundant storage system comprises first and second hosts 101-1 and 101-2. In this exemplary embodiment, the host 101-1 is primarily responsible for data storage and the host 101-2 is the redundant data storage operable to back up the data storage of the host 101-1. The host 101-1 is operable to generate I/O requests for routing to a persistent storage device (i.e., drive 120-1). As the host 101-2 is operable to provide redundancy for the host 101-1, the host 101-1 "side" of the storage system 100 transfers replicated data to the host 101-2 such that the host 101-2 can store the data to the persistent storage device under its control (i.e., the drive 120-2).

Each host 101 is any device, system, software, or combination thereof operable to store data on a corresponding drive 120. Examples of the hosts 101 include computers, computer servers, and other network elements operable to process I/O requests from other computing systems and/or to generate their own I/O requests to the drive 120. Directing the discussion for the moment to the host 101-1, the host 101-1 comprises memory 107-1 (e.g., dynamic random access memory, or "DRAM") and a central processing unit (CPU) 106-1 implementing an operating system (OS) 104-1 that establishes a computing environment for the host 101-1. The OS 104-1, in this regard, comprises a file system 102-1 and various drivers 103-1 (e.g., firmware), as is typical with most computing elements, that are loaded into the memory 107-1 and operable via the CPU 106-1. The host 101-1 also includes an interface 113-1 that is operable to link the host 101-1 (and the storage controller 110-1) to the host 101-2 (and to the storage controller 110-2) through a data network 130.

Examples of the drives 120 include hard disk drives, solid-state drives, and/or other forms of readable/writable persistent storage devices. The drives 120 may also be representative of larger storage volumes. For example, the drive 120-1 may actually be a plurality of persistent storage devices configured as a larger storage volume presented to the host 101-1. In some embodiments, the larger storage volume may be configured to implement a Redundant Array of Independent Disks (RAID) management.

Each host 101 is configured to operate with a storage controller 110 (also known as a host bus adapter, or "HBA"). The storage controller 110 is operable to process and route the I/O requests from the host 101 to its respective drive 120. The OS 104-1 is also configured with a storage controller driver 105-1 (e.g., firmware) that is used to generate/process the I/O requests to the storage controller 110-1. Generally, the storage controller 110-1 includes memory 112-1 (e.g., DRAM) and an I/O processor (IOP) 111-1. The memory 112-1, among other things, is operable to provide caching for the I/O requests to the drive 120-1. As the drive 120 may be representative of a RAID storage volume (e.g., comprising any combination of HDDs and Solid State Drives, or "SSDs"), the storage controller 110 may be a RAID storage controller and in some embodiments a MegaRAID storage controller.

In this embodiment, the memory 112-1 of the storage controller 110-1 is mapped directly to the memory 107-1 of the host 101-1. This mapping may be maintained within persistent storage (e.g., the drive 120-1, a storage device configured with the host 101-1, a storage device configured with the storage controller 110-1, or the like) and is used to provide the storage controller 110-1 with the ability to DMA data to the storage controller 110-2, the storage controller 110-2 having a similar memory mapping. In one embodiment, this persistently stored memory mapping of the memory 107 to the memory 112 is implemented with nonvolatile DRAM, or "NVDRAM". One example of an NVDRAM is shown and described in commonly owned and co-pending U.S. patent application Ser. No. 14/338,645 (filed Jul. 23, 2014), the contents of which are hereby incorporated by reference.

With the memory mapping established, the storage controller 110-1, and more specifically the storage controller driver 105-1, is operable to DMA data from the drive 120-1 to the storage controller 110-1 for storage in the drive 120-2. Additionally, the host 101-1 may be operable to DMA data to the storage controller 110-2 for storage in the drive 120-2 via the storage controller driver 105-1. In any case, the memory mapping of the memory 107-1 of the host 101-1 to the memory 112-1 of the storage controller 110-1 allows the storage controller 110-1 to DMA data. In this regard, the data during a DMA does not traverse through the storage driver stack. For example, data transfers employ a relatively large amount memory and processing. Control information, however, employs much less memory and processing (e.g., a few bytes). The memory mapping allows the host 101-1 to be involved in the control path, deciding where data will flow. The data, however, bypasses the host completely because the processing is performed by the storage controller 110-1 (i.e., via the storage controller driver 105-1). Accordingly, the storage controller 110-1's ability to DMA data alleviates memory and processing consumption of the memory 107-1 and CPU 106-1 of the host 101-1 and improves I/O performance.

While shown and described with respect to the host 101-1 side of the storage system 100, it should be noted that the redundant host 101-2 side of the storage system 100 is generally configured in a similar fashion. That is, the host 101-2 may also include a memory 107-2, a CPU 106-2, an interface 113-2, and an OS 104-2 with a file system 102-2, various drivers 103-2, and a storage controller driver 105-2. The storage controller 110-2 may have similar components such as a memory 112-2, an I/O processor 111-2, and an interface 113-2. One exemplary operation of the storage system 100 is now shown and described with respect to FIG. 2.

Figure 2:
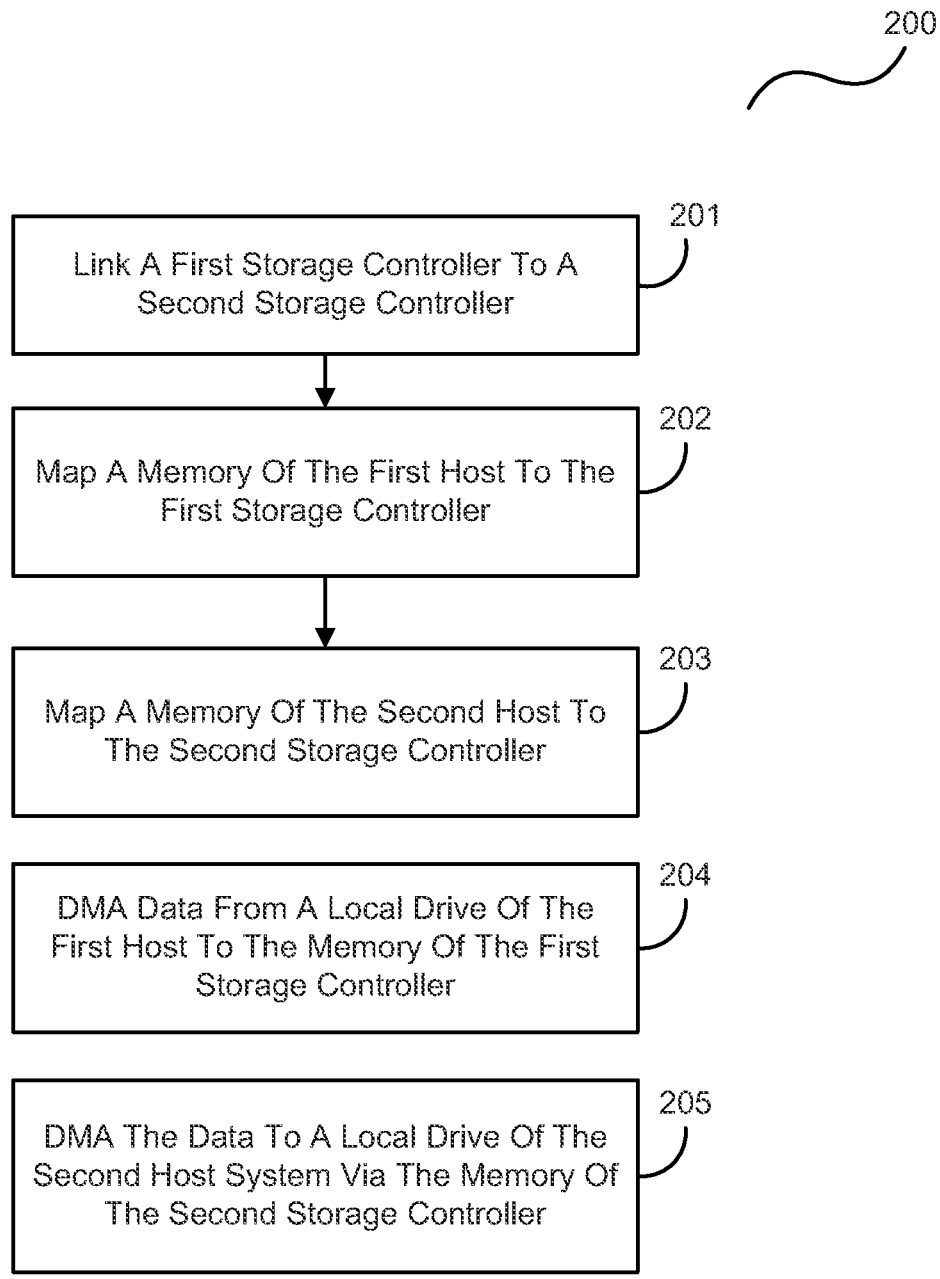
FIG. 2 is a flowchart of an exemplary process of redundant storage systems of FIG. 1.

FIG. 2 is a flowchart of an exemplary process 200 of the redundant storage system 100 of FIG. 1. In the process element 201, storage controllers 110-1 and 110-2 are linked to one another. Generally, such involves establishing communication between the two storage controllers 110-1 and 110-2 via their associated drivers 105-1 and 105-2, respectively. For example, the network 130 may be an Internet network and the interfaces 113-1 and 113-2 are thus Internet protocol components operable to communicate through the Internet. The interfaces 113-1 and 113-2 provide the link that allows the storage controller drivers 105-1 and 105-2 to communicate. Alternatively or additionally, the interfaces 113-1 and 113-2 can be Infiniband or Converged Ethernet so as to provide for remote DMA (RDMA) operations for the storage controllers 110-1 and 110-2. Examples of such are shown and described in greater detail below.

In the process element 202, the memory 107-1 of the host 101-1 is mapped directly to the memory 112-1 of the storage controller 110-1. Similarly, the memory 107-2 of the host 101-2 is mapped to the storage controller 110-2, in the process element 203. From there, the storage controller 110-1 is operable to DMA data from the drive 120-1 under control of the host 101-1 to the memory 112-1 of the storage controller 110-1, in the process element 204. And then, the storage controller 110-1 can DMA the data to the drive 120-2 under control of the host 101-2 via the memory 107-1 of the host 101-1 and the memory 112-2 of the storage controller 110-2, in the process element 205.

Figure 3:
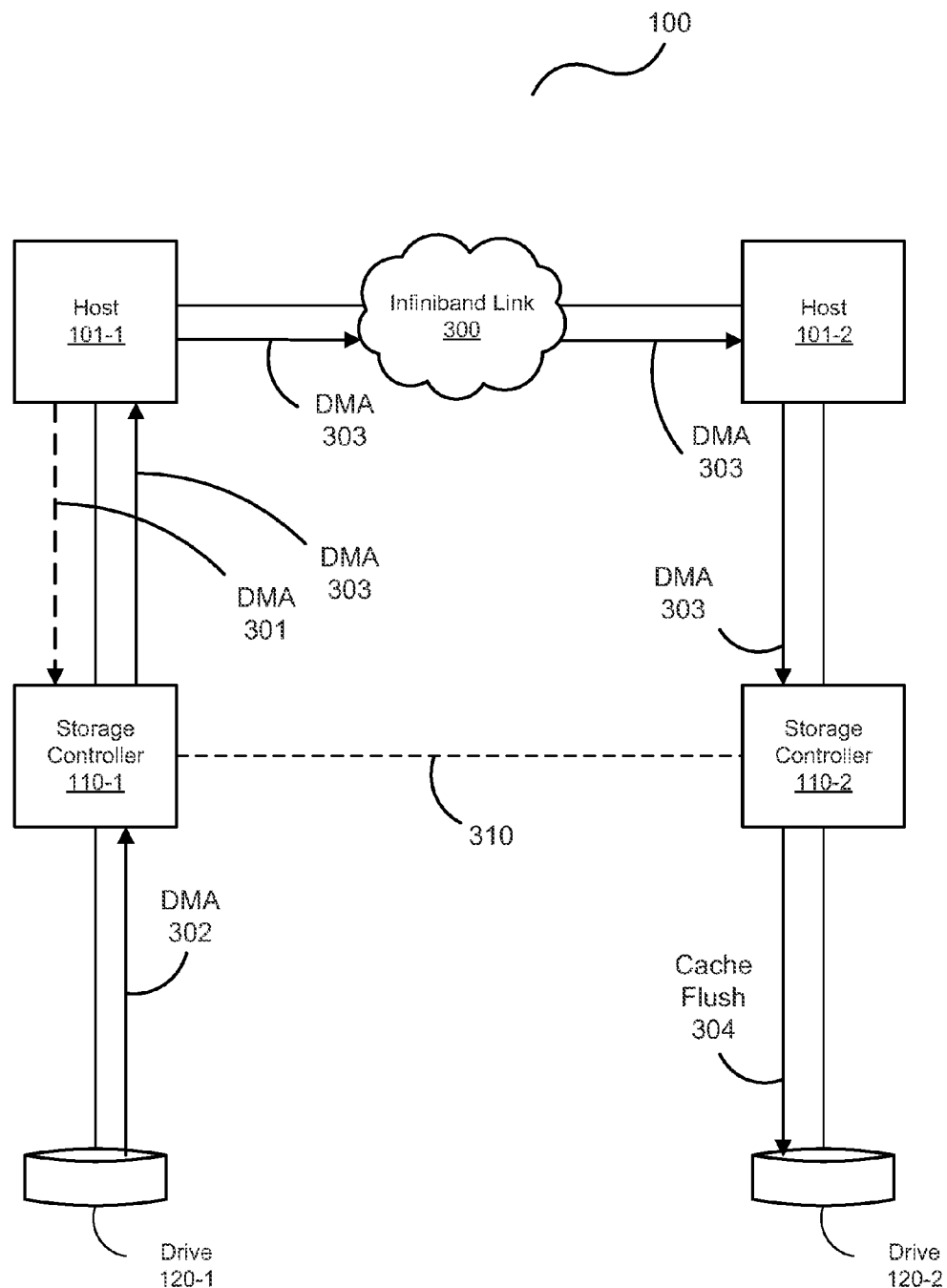
FIGS. 3 and 4 are block diagrams of a redundant storage system exemplarily performing DMAs.
Figure 4:
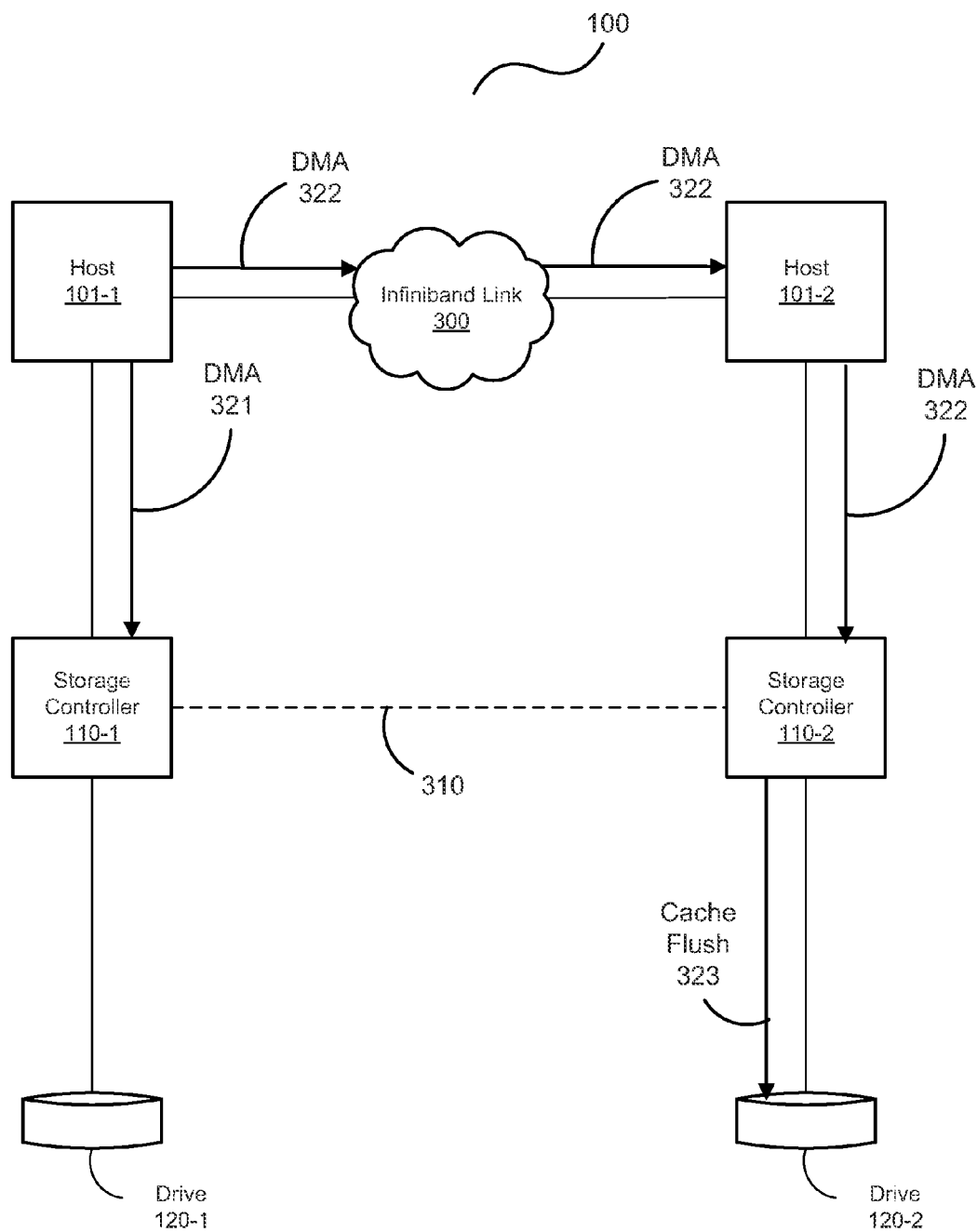

FIGS. 3 and 4 are block diagrams of a redundant storage system exemplarily performing DMAs in accordance with the features described herein. More specifically, in FIG. 3, the storage system 100 is configured to DMA data from the drive 120-1 to the drive 120-2 by way of the storage controller 110-1 and the storage controller driver 105-1. In FIG. 4, the storage system 100 is configured to DMA data from the host 101-1 to the drive 120-2 by way of the storage controller 110-1. In each embodiment, the storage controller drivers 105 essentially link (310) the storage controllers 110 to one another.

In each of these embodiments, the storage system 100 is conducting RDMA operations through an Infiniband link 300. However, as mentioned above, the RDMA operations may be performed over converged Ethernet, referred to herein as RoCE. In any case, the invention is not intended be limited to any particular form of communication network.

Each side of the storage system 100 this configured in a manner similar to that described in FIG. 1. However, for the sake of simplicity, the majority of components of each side of the storage system 100 are not illustrated. Turning now to the DMA operations of the storage controller 110-1 of FIG. 3, the storage controller 110-1 is operable to DMA (301) data from the drive 120-1 to the memory 112-1 of the storage controller 110-1. Such may be implemented through a function call by the host 101-1 (i.e., DMA 310). For example, the storage controller driver 105-1 located in the host 101-1 may present a primitive to the host 101-1 that provides for a local controller to remote controller (LC2RC) DMA that allows the host 101-1 to access a logical block address (LBA) and the desired number of data blocks of the drive 120-1 by way of the storage controller 110-1 (DMA 302), bypassing one or more the components of the host 101-1 (e.g., the file system 102-1, the CPU 106-1, the memory 107-1, etc.). This DMA command includes directions that direct the storage controller 110-1 to transfer the data of the DMA to a remote LBA for the desired number of blocks. In doing so, the storage controller driver 105-1 RDMAs the data of the drive 120-1 from the memory 112-1 of the storage controller 110-1 to the memory 112-2 of the storage controller 110-2 of the redundant host 101-2 via the memory 107-1 of the host 101-1 (i.e., DMA 303). Once residing in the memory 112-2, the storage controller 110-2 flushes the data to the drive 120-2 as a cache flush (304).

As mentioned, this embodiment allows I/O packets to bypass storage stacks (e.g., file system 102, drivers 103, etc.) of both sides of the storage system 100. Additionally, since the data is DMA'd from one side to the other, there is no need to allocate host memory buffers because typical I/O packet generation is no longer required. That is, I/O packets are generally processed by storage controllers to correctly address and access data for the purposes of reading and writing to storage devices, such as the drives 120. Since this information can be configured in a DMA command via the memory mappings between the host 101 and the storage controllers 110, I/O packet generation and its associated overhead can be avoided. Moreover, the CPU 106-2 of the redundant host 101-2 no longer needs to participate in the propagation and processing of I/O packets because the storage controller driver 105-2, already operating on the host 101-2, has the knowledge to ensure that the data arrives at the drive 120-2 without requiring any additional overhead.

In FIG. 4, the host 101-1 is operable to DMA data from the host 101-1 to the storage controller 110-2 by way of the storage controller 110-1. In this embodiment, the storage controller driver 105-1 employs a host to remote controller (H2RC) command that allows the host 101-1 to DMA (321) data from its memory 107-1 to the drive 120-2 via the storage controllers 110-1 and 110-2. Generally, this command employs a host scatter gather list that includes information pertaining to the storage controller 110-2 and the LBA of the driver 120-2. With this command, the host 101-1 can RDMA the data to the memory 112-2 of the storage controller 110-2 via the memory 112-1 of the storage controller 110-1 (DMA 322). From there, the storage controller 110-2 performs a cache flush 323 to the drive 120-2 at the desired location and number of blocks of the DMA command.

Again, the embodiments of FIGS. 3 and 4 are operable to bypass the file systems/storage stacks of their respective hosts 101. While this also serves to bypass the memories 107 and CPUs 106, the storage controllers 110 generally still need to know the mapping of the LBA of the drive 120 and how to flush the data thereto. This, however, can be implemented in a number of ways. For example, in a native distributed file system, the knowledge of the LBA can reside in the file system of the drive 120 itself, which is generally already available to the file systems 102 of the operating systems 104. So, the data can be easily tracked from the file system 102. For a Hadoop distributed file system that runs on top of other file systems, the remote file system 102-2 can be queried to get the LBA map of the drive 120-2. Moreover, the file systems 102 can be configured to run on the storage controllers 110 themselves as RAM disks.

In one exemplary embodiment, data mapping is provided to the remote/redundant host 101-2 to assist in the DMAs. For example, consider the case where the host 101-1 has data in its memory 107-1 and wants to replicate/save the data in the drive 120-2 of the host 101-2. Traditionally, the host 101-1 would send the data over network 130 to the host 101-2, where a host agent would receive the data, store it in the buffer pools of its memory 107-2, open a file using the local file system 102-2, and send the data through the file system 102-2 to the drive 120-2. In these embodiments, the control path is separated from the data path. The control path provides a handshaking of the local and remote hosts 101 including a decision as to where in the LBA range the data will be stored in the remote host 102-2. The data path then defines how the raw data is moved from one host 101 to another and to its ultimate destination (e.g., its final storage place in the drive 120-2).

For the control path, the flow of control information is similar to what happens in traditional approach. That is, a local system agent (possibly a service) of the host 101-1 sends a message to the remote system counterpart, informing it that a large file, including its size, needs to be transferred. The system agent of the remote host 101-2 then queries the file system 102-2 for the layout and LBA range of the incoming data and where it is to be stored.

Different file systems have different data layouts. Some are relatively simple while others are relatively complicated. For example, some file systems include an application programming interface (API) for querying the LBA range. Other file systems, however, may need to be modified to support this behavior. Once the remote system agent of the host 101-2 receives the LBA range, it sends the LBA information to the remote storage controller 110-2 and to the originating host 101-1 informing them that the incoming I/O data is to be moved to a particular LBA range.

From that point onwards, the OS 104-2 stack of the remote host 101-2 is isolated from the data path and the data is DMA'd from the memory 107-1 of the host 101-1 to the memory 107-2 of the remote host 101-2 and then to the drive 120-2 via the storage controller 110-2 and its memory 112-2. Thus, the data path does not consume system resources of the hosts 101. And, while being DMA'd, the data does not transit through the memory 107-2 of the host 101-2. Accordingly, no space needs to be allocated there for holding the data, alleviating any competition with other OS specific memory requirements.

It should be noted that the invention is not intended to be limited to the illustrated embodiments. For example, the various forms of DMAs performed herein may be implemented on more hosts 101 than are illustrated. That is, storage operations may be performed on a network wide basis with a plurality of hosts. In this regard, the hosts 101 may be operable to DMA to any of the other hosts 101 in the network.

Figure 5:
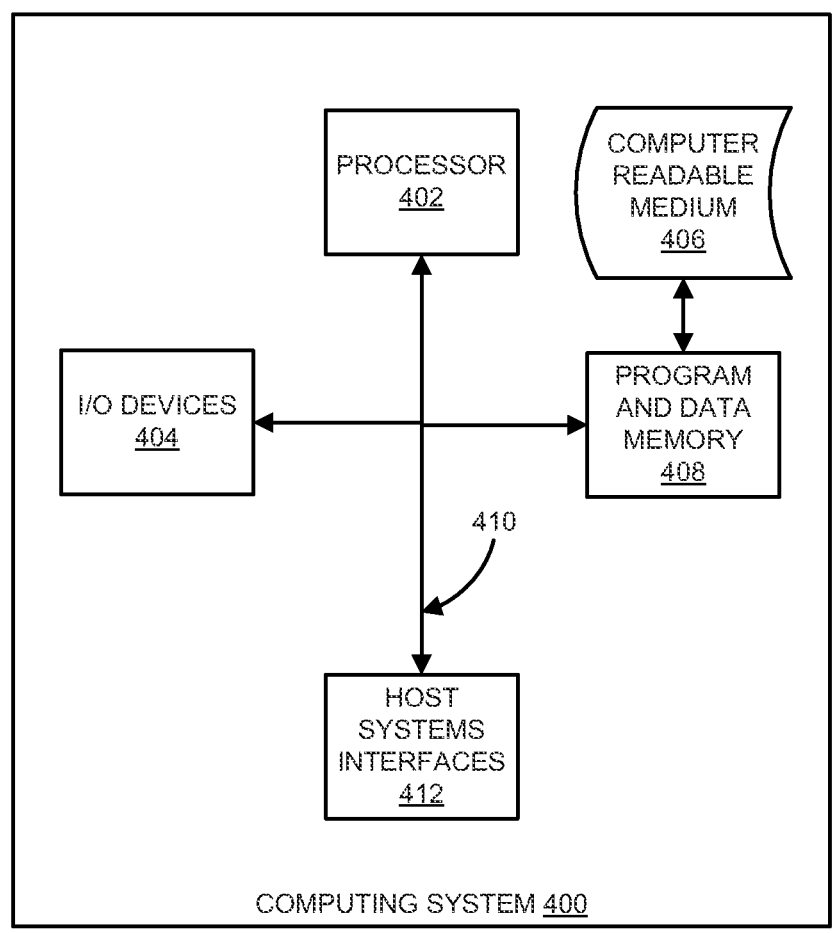
FIG. 5 illustrates an exemplary computer system operable to execute programmed instructions to perform desired functions described herein.

Additionally, the invention can take the form of an entirely hardware embodiment, an entirely software embodiment or an embodiment containing both hardware and software elements. In one embodiment, the invention is implemented in software, which includes but is not limited to firmware, resident software, microcode, etc. FIG. 5 illustrates a computing system 400 in which a computer readable medium 406 may provide instructions for performing any of the methods disclosed herein.

Furthermore, the invention can take the form of a computer program product accessible from the computer readable medium 406 providing program code for use by or in connection with a computer or any instruction execution system. For the purposes of this description, the computer readable medium 406 can be any apparatus that can tangibly store the program for use by or in connection with the instruction execution system, apparatus, or device, including the computer system 400.

The medium 406 can be any tangible electronic, magnetic, optical, electromagnetic, infrared, or semiconductor system (or apparatus or device). Examples of a computer readable medium 406 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 400, suitable for storing and/or executing program code, can include one or more processors 402 coupled directly or indirectly to memory 408 through a system bus 410. The memory 408 can include local memory employed during actual execution of the program code, bulk storage, and cache memories which provide temporary storage of at least some program code in order to reduce the number of times code is retrieved from bulk storage during execution. Input/output or I/O devices 404 (including but not limited to keyboards, displays, pointing devices, etc.) can be coupled to the system either directly or through intervening I/O controllers. Network adapters may also be coupled to the system to enable the computing system 400 to become coupled to other data processing systems, such as through host systems interfaces 412, or remote printers or storage devices through intervening private or public networks. Modems, cable modem and Ethernet cards are just a few of the currently available types of network adapters.

What is claimed is:

1. A storage system, comprising:
   first and second host systems each comprising a memory and configured with a persistent storage device; and
   first and second storage controllers each comprising a memory,
   wherein the first storage controller is communicatively coupled to the first host system and to the second storage controller,
   wherein the second storage controller is communicatively coupled to the second host system,
   wherein the memory of the first storage controller is mapped to the memory of the first host system and the memory of the second storage controller is mapped to the memory of the second host system,
   wherein the first storage controller is operable to direct memory access (DMA) data from the persistent storage device of the first host system to the memory of the first storage controller via a driver of the first host system that presents a signal to the first host system to allow the first host system to access a logical block address and a desired number of data blocks of the persistent storage device of the first host system by way of the first storage controller, and to direct the second storage controller to DMA the data to the persistent storage device of the second host system via the memory of the second storage controller, and
   wherein the first storage controller DMAs the data such that the data travels through the first and second host systems while bypassing one or more components of the first and second host systems.

2. The storage system of claim 1, wherein:
   the first host system is operable to DMA other data to the first storage controller;
   the first storage controller is operable to DMA the other data from the first storage controller to the second storage controller; and
   the second storage controller is operable to DMA the other data to the second persistent storage device via the memory of the second storage controller.

3. The storage system of claim 1, wherein:
   the driver comprises a remote DMA (RDMA) firmware module linked to the memory of the first storage controller and operable to direct the first storage controller to DMA the data from the persistent storage device of the first host system to the memory of the first storage controller.

4. The storage system of claim 3, wherein:
   the RDMA firmware module is an Infiniband firmware module or an RDMA over Converged Ethernet firmware module.

5. The storage system of claim 3, wherein:
   the first host system comprises a file system; and
   the one or more components bypassed includes the file system of the first host system.

6. The storage system of claim 1, wherein:
   the first storage controller is a Mega-Redundant Array of Independent Disks controller.

7. A method for replicating data across first and second host systems, the method comprising:
   linking a first storage controller to a second storage controller, wherein the first storage controller is communicatively coupled to the first host system and the second storage controller is communicatively coupled to the second host system and wherein the first storage controller is communicatively coupled to a first persistent storage device of the first host system and the second storage controller is communicatively coupled to a second persistent storage device of the second host system;
   mapping a memory of the first host system to the first storage controller;
   mapping a memory of the second host system to the second storage controller;
   direct memory accessing (DMAing) data from the first persistent storage device to the memory of the first storage controller via a driver of the first host system that presents a signal to the first host system to allow the first host system to access a logical block address and a desired number of data blocks of the persistent storage device of the first host system by way of the first storage controller; and
   DMAing the data to the second persistent storage device via the memory of the second storage controller to replicate the data of the first persistent storage device,
   wherein the DMAing operations occur such that the data travels through the first and second host systems while bypassing one or more components of the first and second host systems.

8. The method of claim 7, further comprising:
   DMAing other data from the first host system to the first storage controller;
   DMAing the other data from the first storage controller to the second storage controller; and
   DMAing the other data to the second persistent storage device via the memory of the second storage controller.

9. The method of claim 7, wherein:
   the driver comprises a remote DMA (RDMA) firmware module linked to the memory of the first storage controller; and
   the method further comprises directing the first storage controller to DMA the data from the first persistent storage device to the memory of the first storage controller via the RDMA firmware module.

10. The method of claim 9, wherein:
    the RDMA firmware module is an Infiniband firmware module or a RDMA over Converged Ethernet firmware module.

11. The method of claim 9, wherein:
    the first host system comprises a file system; and
    the one or more components bypassed includes the file system of the first host system.

12. The method of claim 7, wherein:
    the first storage controller is a Mega-Redundant Array of Independent Disks controller.

13. A non-transitory computer readable medium for replicating data in a storage system across first and second host systems, the computer readable medium comprising instructions that:
    link a first storage controller to a second storage controller, wherein the first storage controller is communicatively coupled to the first host system and the second storage controller is communicatively coupled to the second host system and wherein the first storage controller is communicatively coupled to a first persistent storage device of the first host system and the second storage controller is communicatively coupled to a second persistent storage device of the second host system;

map a memory of the first host system to the first storage controller;

map a memory of the second host system to the second storage controller;

direct memory access (DMA) data from the first persistent storage device to the memory of the first storage controller via a driver of the first host system that presents a signal to the first host system to allow the first host system to access a logical block address and a desired number of data blocks of the persistent storage device of the first host system by way of the first storage controller; and DMA the data to the second persistent storage device via the memory of the second storage controller to replicate the data of the first persistent storage device, wherein the driver comprises a remote DMA (RDMA) firmware module linked to the memory of the first storage controller, wherein the computer readable medium further comprises instructions that direct the first storage controller to DMA the data from the first persistent storage device to the memory of the first storage controller via the RDMA firmware module, and wherein the DMAing operations occur such that i) the data travels through the first host system while bypassing one or more components of the first host system, and ii) the data travels through the second host system while bypassing one or more components of the second host system.

14. The computer readable medium of claim 13, further comprising instructions that:

DMA other data from the first host system to the first storage controller;

DMA the other data from the first storage controller to the second storage controller; and DMA the other data to the second persistent storage device via the memory of the second storage controller.

15. The computer readable medium of claim 13, wherein: the RDMA firmware module is an Infiniband firmware module or a RDMA over Converged Ethernet firmware module.

16. The computer readable medium of claim 13, wherein: the first host system comprises a file system; and the one or more components bypassed includes the file system of the first host system.

17. The computer readable medium of claim 13, wherein: the first storage controller is a Mega-Redundant Array of Independent Disks controller.

18. A storage controller operable with a host in a redundant storage system, the storage controller comprising:

an Input/Output (I/O) processor operable to process I/O requests from the host to a drive associated with the host;

a memory coupled to the I/O processor and mapped to a memory of the host to implement a nonvolatile dynamic random access memory; and an interface operable to communicatively couple to another storage controller in the redundant storage system, wherein the I/O processor is further operable to direct memory access (DMA) data from the memory of the host to the memory of the storage controller based on a DMA command from a driver of the host that presents a signal to the host to allow the host to access a logical block address and a desired number of data blocks of the drive by way of the I/O processor, and to direct the other storage controller to DMA the data to another drive associated with the other storage controller, and wherein the I/O processor DMAs the data such that the data travels through the first and second host systems while bypassing one or more components of the first and second host systems.

19. The storage controller of claim 18, wherein: wherein the DMA command is operable within a storage controller driver of the host.

20. The storage controller of claim 19, wherein: the DMA command is configured from Infiniband firmware or from RDMA over Converged Ethernet firmware.

21. The storage controller of claim 18, wherein: the I/O processor is further operable to DMA other data from the drive associated with the host to the memory, and to DMA the other data from the memory to the drive associated with the other storage controller via a memory of the other storage controller.

22. A non-transitory computer readable medium for replicating data in a storage system across first and second host systems, the computer readable medium comprising instructions that include first and second commands that direct an attached storage controller to direct memory access (DMA) data, wherein:

the first command directs the attached storage controller to DMA data from a drive associated with the attached storage controller to a memory of a remote storage controller, and to DMA the data from the memory of the remote storage controller to a drive associated with the remote storage controller;

the second command directs the attached storage controller to DMA data from a memory of the first host system to the memory of the remote storage controller, and to DMA the host memory data to the drive associated with the remote storage controller; and the first command and the second command direct the attached storage controller such that the data travels through the first and second host systems while bypassing one or more components of the first and second host systems.

23. The non-transitory computer readable medium of claim 22, wherein:

the memory of the attached storage controller is mapped to the memory of the first host system.

24. The non-transitory computer readable medium of claim 23, wherein:

the mapping between the memory of the attached storage controller and the memory of the first host system is maintained in a nonvolatile dynamic random access memory (NVDRAM).

* * * * *